(12) United States Patent
Kawasumi

(10) Patent No.: US 11,909,413 B2
(45) Date of Patent: Feb. 20, 2024

(54) SEMICONDUCTOR INTEGRATED CIRCUIT AND ANALOG-TO-DIGITAL CONVERTER

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 342 days.

(21) Appl. No.: 17/471,887

(22) Filed: Sep. 10, 2021

(65) Prior Publication Data

US 2022/0302923 A1    Sep. 22, 2022

(30) Foreign Application Priority Data

Mar. 19, 2021 (JP) .................. 2021-046249

(51) Int. Cl.
*H03M 1/36* (2006.01)
*H03M 1/20* (2006.01)
*G11C 7/22* (2006.01)
*G11C 7/16* (2006.01)

(52) U.S. Cl.
CPC ............... *H03M 1/206* (2013.01); *G11C 7/16* (2013.01); *G11C 7/22* (2013.01)

(58) Field of Classification Search
CPC ............................ H03M 1/206; H03M 1/207
USPC ........................................................ 341/159
See application file for complete search history.

(56) References Cited

U.S. PATENT DOCUMENTS

| | | | |
|---|---|---|---|
| 10,340,003 B1 | 7/2019 | Chang et al. | |
| 2010/0138633 A1* | 6/2010 | Cooke ................. | G06F 15/8015 712/E9.002 |
| 2010/0246607 A1* | 9/2010 | Kawajiri ................. | H04J 3/047 370/498 |
| 2015/0372679 A1* | 12/2015 | Kee ......................... | G05F 1/463 327/543 |
| 2019/0042160 A1 | 2/2019 | Kumar et al. | |
| 2019/0102170 A1 | 4/2019 | Chen et al. | |

* cited by examiner

*Primary Examiner* — Peguy Jean Pierre
(74) *Attorney, Agent, or Firm* — Foley & Lardner LLP

(57) ABSTRACT

A semiconductor integrated circuit has a digital signal generator that generates a binary signal whose logic transitions at a timing according to a discharge amount of a second wiring which is discharged when multiplication data of first data stored in a memory cell and second data on a first wiring is a first logic; and a transition timing detector that detects a timing at which the logic of the binary signal transitions.

20 Claims, 14 Drawing Sheets

|  | | Weight | |
|---|---|---|---|
| | | 0 | 1 |
| WL<+> | 0 | — | — |
| | 1 | — | ↓BL<+> |
| WL<−> | 0 | — | — |
| | 1 | ↓BL<−> | — |

US 11,909,413 B2

SEMICONDUCTOR INTEGRATED CIRCUIT AND ANALOG-TO-DIGITAL CONVERTER

CROSS REFERENCE TO RELATED APPLICATIONS

This application is based upon and claims the benefit of priority from the prior Japanese Patent Application No. 2021-046249, filed on Mar. 19, 2021, the entire contents of which are incorporated herein by reference.

FIELD

Embodiments of the present invention relate to a semiconductor integrated circuit and an analog-to-digital converter.

BACKGROUND

Recently, information processing using machine learning has been performed in various fields. In machine learning, for example, a learning process of updating a weighting factor used in a convolutional neural network (CNN) is performed, but it is necessary to repeat a large number of product-sum operation processing in order to update the weighting factor. If the product-sum operation processing can be performed by hardware instead of software, machine learning can be performed quickly and efficiently.

Since a result of the product-sum operation is multi-value data of two or more values, a wiring that outputs the result of the product-sum operation may have three or more potential levels. Therefore, it is necessary to correctly identify a product-sum operation value from the potential level of the wiring that outputs the result of the product-sum operation.

In addition, in a case where the product-sum operation is performed by hardware, it is desirable to convert the potential level of the wiring representing the product-sum operation value into a digital signal and perform digital signal processing.

DETAILED DESCRIPTION

According to one embodiment, a semiconductor integrated circuit has a digital signal generator that generates a binary signal whose logic transitions at a timing according to a discharge amount of a second wiring which is discharged when multiplication data of first data stored in a memory cell and second data on a first wiring is a first logic; and a transition timing detector that detects a timing at which the logic of the binary signal transitions.

Hereinafter, embodiments of a semiconductor integrated circuit and an analog-to-digital converter will be described with reference to the drawings. Although main components of the semiconductor integrated circuit and the analog-to-digital converter will be mainly described hereinafter, the semiconductor integrated circuit and the analog-to-digital converter may have components and functions that are not illustrated or described. The following description does not exclude the components and functions that are not illustrated or described.

Figure 1:
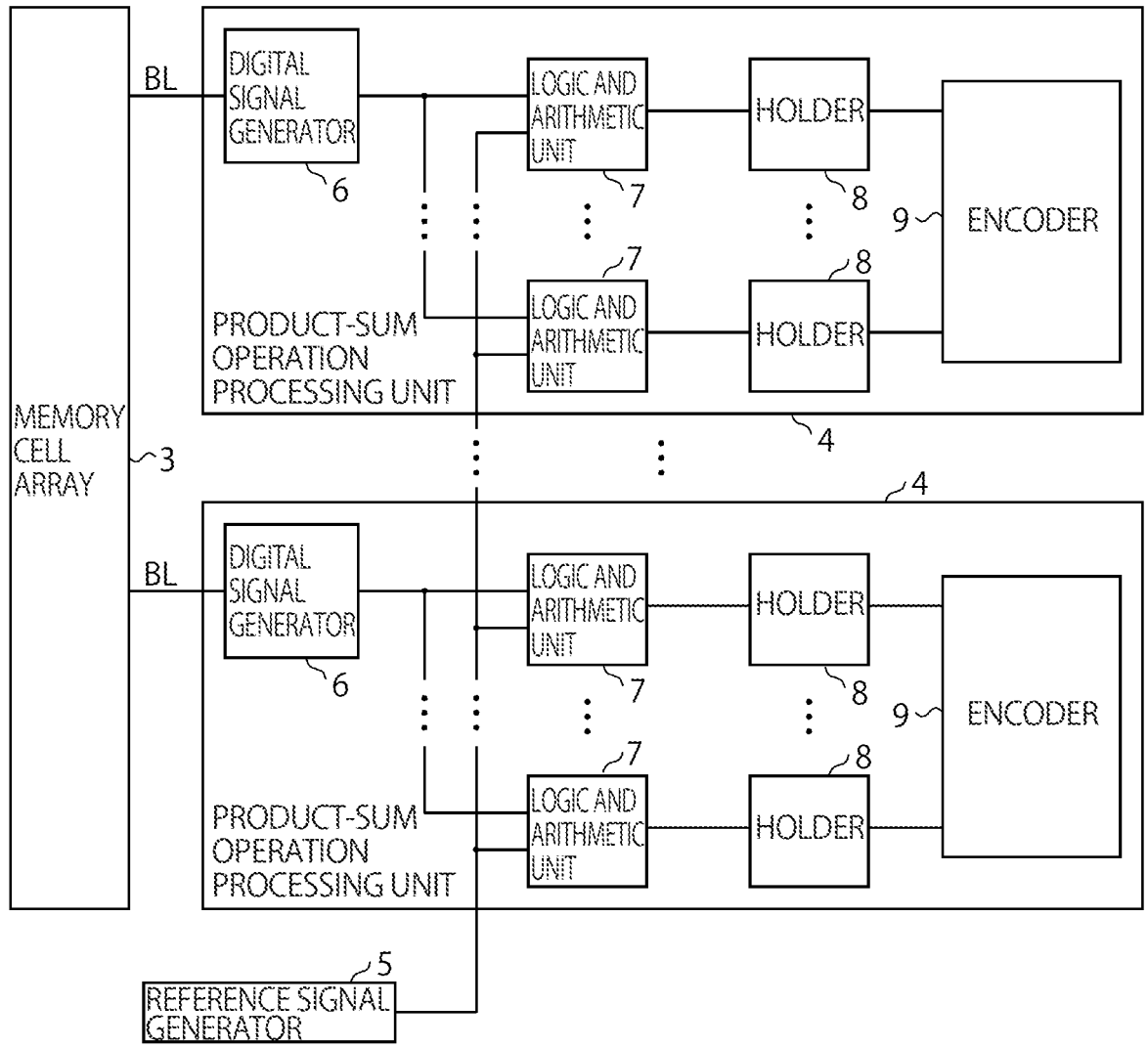
FIG. 1 is a block diagram illustrating a schematic configuration of an analog-to-digital converter including a semiconductor integrated circuit according to an embodiment.

FIG. 1 is a block diagram illustrating a schematic configuration of an analog-to-digital converter 2 including a semiconductor integrated circuit 1 according to an embodiment. The semiconductor integrated circuit 1 of FIG. 1 includes a memory cell array 3, a plurality of product-sum operation processing units 4, and a reference signal generator 5.

The memory cell array 3 includes a plurality of memory cells MC arranged in two-dimensional directions. Note that it is sufficient to include at least two or more memory cells MC arranged in one direction in the present embodiment, and it is not always essential to arrange the plurality of memory cells MC in the two-dimensional directions. In addition, a plurality of memory cells MC arranged in three-dimensional directions may be provided. The memory cell MC may be a volatile memory, such as a static random access memory (SRAM) cell and a dynamic random access memory (DRAM) cell, or may be a nonvolatile memory such as a NAND flash memory cell MC and a magnetoresistive random access memory (MRAM).

Each of the plurality of product-sum operation processing units 4 is connected to a bit line output from the memory cell array 3. The semiconductor integrated circuit 1 according to the present embodiment includes one product-sum operation processing unit 4 connected to one bit line as a minimum configuration. Thus, it is not always necessary to include the plurality of product-sum operation processing units 4.

The product-sum operation processing unit 4 includes a digital signal generator 6 and a plurality of arithmetic and logic units 7 as essential components.

The digital signal generator 6 generates a binary signal whose logic transitions at a timing corresponding to a discharge amount of a second wiring (for example, a bit line) discharged when multiplication data of first data stored in the corresponding memory cell MC and second data on a first wiring (for example, a word line) is a first logic. The first logic is, for example, 1.

The plurality of arithmetic and logic units 7 are also collectively referred to as a transition timing detector. The transition timing detector detects the timing at which the logic of the binary signal transitions. More specifically, the plurality of arithmetic and logic units 7 constituting the transition timing detector compares the binary signal output from the digital signal generator 6 with a plurality of reference binary signals whose logics transition at timings corresponding to different discharge amounts of bit lines.

In this manner, the reference binary signals having different logic transition timings are input to the plurality of arithmetic and logic units 7, respectively. An output logic differs between an arithmetic and logic unit 7 to which a reference binary signal whose logic transitions at a timing earlier than a timing at which the logic of the binary signal from the digital signal generator 6 changes is input, and an arithmetic and logic unit 7 to which a reference binary signal whose logic transitions at a timing later than the timing at which the logic of the binary signal changes is input.

That is, the arithmetic and logic unit 7 to which the reference binary signal whose logic transitions at the timing earlier than the timing at which the logic of the binary signal changes is input outputs a signal of the first logic. The arithmetic and logic unit 7 to which the reference binary signal whose logic transitions at the timing later than the timing at which the logic of the binary signal changes is input outputs a signal of a second logic. The discharge amount of the second wiring is identified by the number of the arithmetic and logic units 7 outputting the signal of the first logic and the number of the arithmetic and logic units 7 outputting the signal of the second logic.

As a result, it is possible to grasp the timing at which the logic of the binary signal from the digital signal generator 6 has transitioned by monitoring output logics of the plurality of arithmetic and logic units 7.

The product-sum operation processing unit 4 may include a plurality of holders 8 and an encoder 9. The analog-to-digital converter 2 is configured by providing the digital signal generator 6, the plurality of arithmetic and logic units 7, the plurality of holders 8, and the encoder 9 in the product-sum operation processing unit 4.

The plurality of holders 8 hold a plurality of signals output from the plurality of arithmetic and logic units 7. Since the plurality of signals are held by the plurality of holders 8, a state when the output signals of the plurality of arithmetic and logic units 7 have transitioned for the first time can be held even if outputs of the plurality of arithmetic and logic units 7 change thereafter.

The encoder 9 generates a digital signal corresponding to the discharge amount of the bit line based on the plurality of signals held by the plurality of holders 8.

The reference signal generator 5 generates a plurality of reference binary signals. The plurality of reference binary signals generated by the reference signal generator 5 are supplied to the plurality of product-sum operation processing units 4. In this manner, the reference signal generator 5 can be shared by the plurality of product-sum operation processing units 4. The reference signal generator 5 generates the plurality of reference binary signals corresponding to different discharge amounts of the second wirings.

Figure 2:
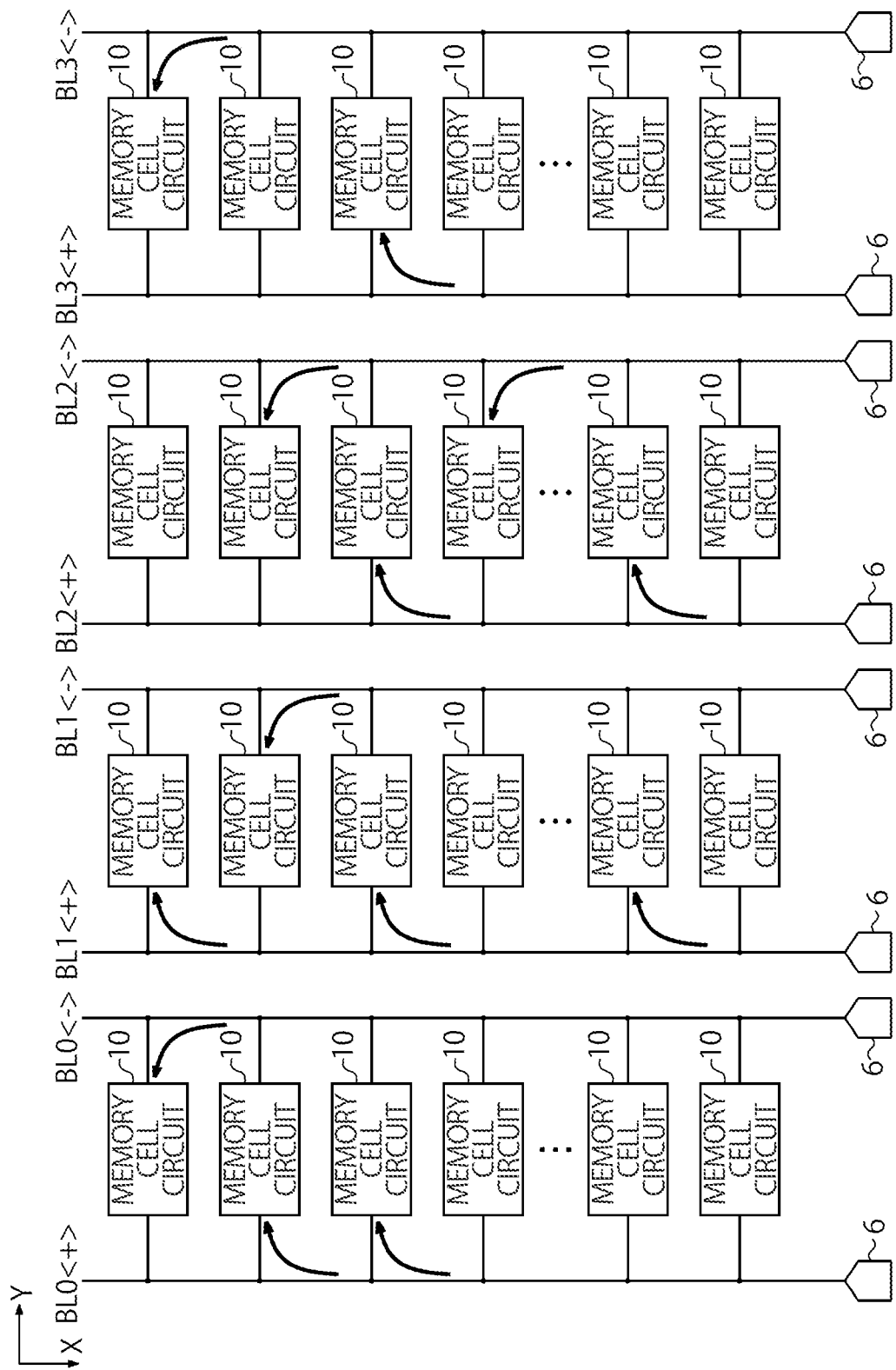
FIG. 2 is a block diagram illustrating a schematic internal configuration of a memory cell array in FIG. 1.

FIG. 2 is a block diagram illustrating a schematic internal configuration of the memory cell array 3 of FIG. 1. In the memory cell array 3 of FIG. 2, a plurality of bit line pairs BL<+> and BL<−> each extending in a first direction X are arranged in a second direction Y. The plurality of memory cells MC arranged along the first direction X are connected to each of the bit line pairs BL<+> and BL<−>. The digital signal generator 6 is connected to one end side of each of the bit line pairs BL<+> and BL<−>. In FIG. 2, the plurality of bit line pairs BL<+> and BL<−> are arranged in the second direction Y, but it suffices that at least one bit line pair BL<+> and BL<−> is arranged.

An arrow line in FIG. 2 indicates a direction of the discharge current flowing through the bit line pair BL<+> and BL<−>. When the discharge current flows from one bit line BL<+> or the other bit line BL<−> to each of memory cell circuits 10, the one bit line BL<+> or the other bit line BL<−> is discharged. As illustrated in FIG. 2, any one of the bit line BL<+> and the other bit line BL<−> is discharged, or both of the bit lines BL<+> and BL<−> are not discharged in the semiconductor integrated circuit 1 of FIG. 1.

Figure 3:
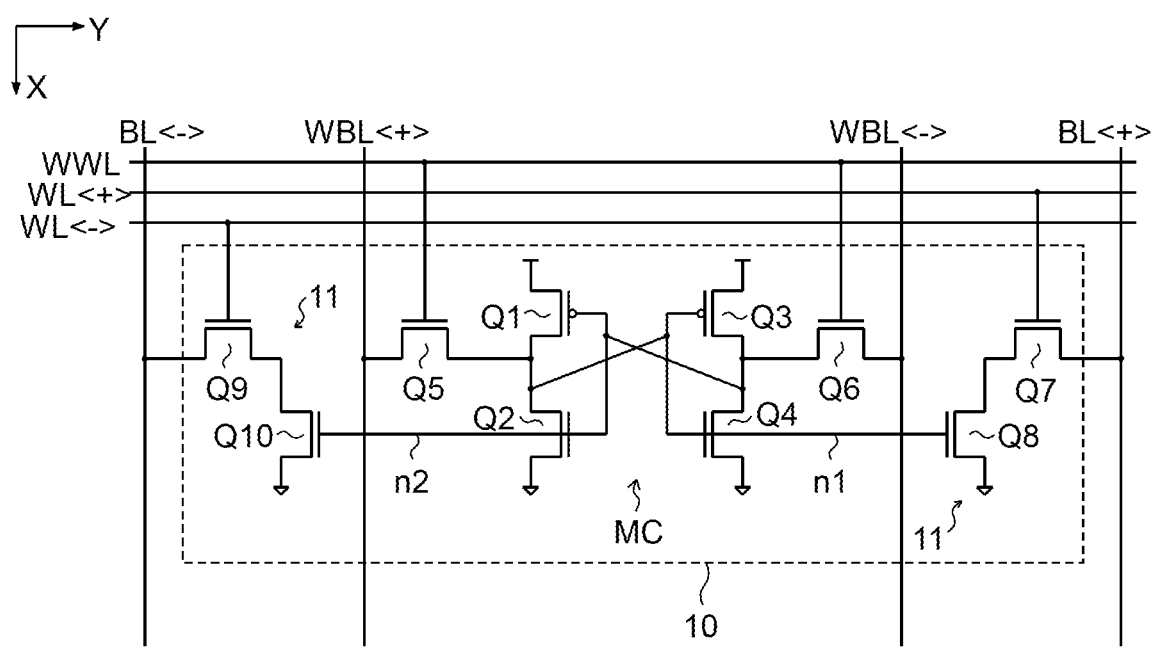
FIG. 3 is a circuit diagram illustrating an example of an internal configuration of a memory cell.

FIG. 3 is a circuit diagram illustrating an example of an internal configuration of the memory cell MC. The memory cell MC of FIG. 3 is connected to a write bit line pair WBL<+> and WBL<−>. The write bit line pair WBL<+> and WBL<−> is also arranged in the first direction X similarly to the bit line pair BL<+> and BL<−>.

The memory cell MC of FIG. 3 illustrates an example of an SRAM cell. The memory cell MC of FIG. 3 includes six transistors Q1 to Q6. The transistors Q1 and Q3 are PMOS transistors, and the transistors Q2 and Q4 to Q6 are NMOS transistors. The transistors Q1 and Q2 are cascode-connected between a power supply voltage node and a ground node.

Similarly, the transistors Q3 and Q4 are cascode-connected between the power supply voltage node and the ground node. Both gates of the transistors Q1 and Q2 are connected to both drains of the transistors Q3 and Q4 and a source of the transistor Q6. Similarly, both gates of the transistors Q3 and Q4 are connected to both drains of the transistors Q1 and Q2 and a source of the transistor Q5.

Both gates of the transistors Q5 and Q6 are connected to a write word line WWL. Both drains of the transistors Q5 and Q6 are connected to the write bit line pair WBL<+> and WBL<−>.

The memory cell array 3 of FIG. 1 includes an arithmetic control circuit 11 for each of the memory cells MC. The arithmetic control circuit 11 is connected between the bit line pair BL<+> and BL<−> and output nodes n1 and n2 of the corresponding memory cell MC. The arithmetic control circuit multiplies the first data output from the corresponding memory cell MC and the second data supplied from the corresponding word line, and discharges the one bit line BL<+> or the other bit line BL<−> based on a multiplication result. The discharge of the one bit line BL<+> or the other bit line BL<−> is equivalent to performing a sum operation of multiplication results, that is, a product-sum operation. In the present specification, the memory cell MC and the corresponding arithmetic control circuit 11 are collectively referred to as the memory cell circuit 10.

The arithmetic control circuit 11 includes transistors Q7 to Q10. The transistors Q7 to Q10 are NMOS transistors. The transistors Q7 and Q8 are cascode-connected between the one bit line BL<+> and the ground node. A gate of the transistor Q7 is connected to a word line WL<+>. A gate of the transistor Q8 is connected to the gates of the transistors Q1 and Q2 and both the drains of the transistors Q3 and Q4.

The transistors Q9 and Q10 are cascode-connected between the other bit line BL<−> and the ground node. A gate of the transistor Q9 is connected to a word line WL<−>. A gate of the transistor Q10 is connected to the gates of the transistors Q3 and Q4 and both the drains of the transistors Q1 and Q2.

As described above, the semiconductor integrated circuit 1 of FIG. 1 can be used to perform a product-sum operation. The memory cell MC can store a weighting factor for the product-sum operation as the first data. The logics of the word lines WL<+> and WL<−> correspond to the second data to be multiplied by the weighting factor in the product-sum operation. In this manner, the first data representing the weighting factor and the second data supplied from the word line can be multiplied using one memory cell MC. In the plurality of memory cell circuits 10 connected to the bit line pair BL<+> and BL<−>, a multiplication of the first data representing the weighting factor and the second data supplied from the word line can be performed a plurality of times, and a result of the product-sum operation, which is a sum of these multiplications can be represented by a discharge amount of the bit line pair BL<+> and BL<−>. Thus, the result of the product-sum operation can be output from the bit line pair BL<+> and BL<−>.

Figures 4, 5:
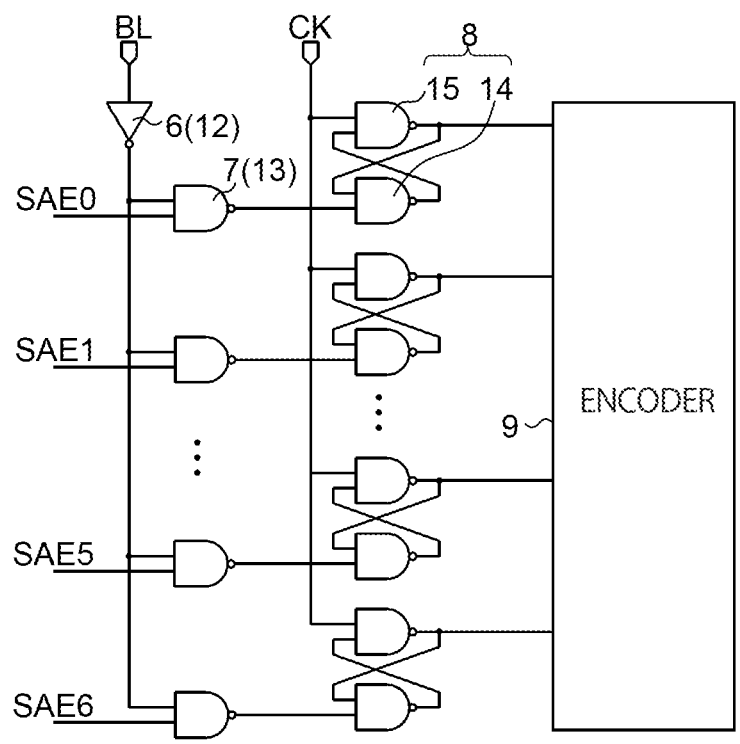
FIG. 4 is a diagram illustrating a correspondence relationship between a multiplication result of first data indicating a weighting factor in the memory cell of FIG. 1 and second data indicating a logic of a word line and discharge of a bit line pair.
FIG. 5 is a circuit diagram illustrating examples of specific configurations of a digital signal generator, a plurality of arithmetic and logic units, and a plurality of holders in a product-sum operation processing unit of FIG. 1.

FIG. 4 is a diagram illustrating a correspondence relationship between the multiplication result of first data indicating the weighting factor in the memory cell MC of FIG. 1 and the second data indicating the logics of the word lines WL<+> and WL<−> and the discharge of the bit line pair BL<+> and BL<−>. As illustrated in FIG. 4, both the first data and the second data can take binary data (0 and 1). The bit line BL<+> is discharged only when both the first data and the second data are 1. The second data becomes 1 when the word line WL<+> is selected. The bit line BL<−> is discharged only when the first data is 0 and the second data is 0. The second data becomes 0 when the word line WL<−> is selected. For example, if 1 is stored in the memory cell MC when the word line WL<+> is selected, both the transistors Q7 and Q8 are turned on, and the one bit line BL<+> is discharged to the ground node through the transistors Q7 and Q8, and a potential decreases. If 0 is stored in the memory cell MC when the word line WL<−> is selected, both the transistors Q9 and Q10 are turned on, and the other bit line BL<−> is discharged to the ground node through the transistors Q9 and Q10, and a potential decreases.

FIG. 5 is a circuit diagram illustrating examples of specific configurations of the digital signal generator 6, the plurality of arithmetic and logic units 7, and the plurality of holders 8 in the product-sum operation processing unit 4 of FIG. 1. FIG. 5 illustrates the digital signal generator 6 connected to one bit line, the plurality of arithmetic and logic units 7 to which an output signal from the digital signal generator 6 is input, the plurality of holders 8 to which output signals of the plurality of arithmetic and logic units 7 are input, and the encoder 9 to which output signals of the plurality of holders 8 are input. Note that the digital signal generator 6 can include a first digital signal generator corresponding to the bit line BL<+> and a second digital signal generator corresponding to the bit line BL<−>. The plurality of arithmetic and logic units 7 can be provided separately to correspond each of to the first digital signal generator and the second digital signal generator. Similarly, the plurality of holders 8 can also be provided separately to correspond each of to the first digital signal generator and the second digital signal generator.

The example of FIG. 5 illustrates an example in which the digital signal generator 6 includes an inverter (logic inverter) 12. Although the digital signal generator 6 includes not only the inverter 12 but also other circuit components as will be described later, FIG. 5 illustrates the example in which the digital signal generator 6 includes the inverter 12 as the simplest configuration. A bit line BL is connected to an input node of the inverter 12 in FIG. 5. The inverter 12 causes a transition of an output logic when a potential of the bit line BL becomes equal to or lower than a threshold voltage. A timing at which the output logic of the inverter 12 transitions varies depending on a discharge amount of the bit line BL. As the discharge amount of the bit line BL increases, the potential of the bit line BL decreases earlier. Therefore, the timing at which the output logic of the inverter 12 transitions also becomes faster. In this manner, the discharge amount of the bit line BL can be grasped by the timing at which the output logic of the inverter 12 transitions.

The plurality of arithmetic and logic units 7 can include a plurality of NAND gates 13. An output signal of the inverter 12 is input to one input node of each of the NAND gates 13, and a corresponding reference binary signal is input to the other input node of each of the NAND gates 13. Timings at which the logics of the plurality of reference binary signals input to the plurality of NAND gates 13 transition are different from each other.

Each of the arithmetic and logic units 7 outputs a low-level signal only when both the output signal of the inverter 12 and the corresponding reference binary signal are at a high level. That is, each of the arithmetic and logic units 7 outputs a high-level signal when the output signal of the inverter 12 is at a low level or the corresponding reference binary signal is at the low level.

The output signal of the inverter 12 transitions from the low level to the high level at a timing according to the discharge amount of the bit line. Therefore, at the timing when the output signal of the inverter 12 transitions to the high level, the output of the NAND gate 13 to which the reference binary signal already at the high level is input transitions to the low level, and the output of the NAND gate 13 to which the reference binary signal still at the low level is input maintains the high level.

Thus, the discharge amount of the bit line can be identified by counting the number of high-level or low-level signals among the output signals of the plurality of arithmetic and logic units 7. The output signals of the plurality of arithmetic and logic units 7 are at the high level in an initial state. In addition, the discharge amount of the bit line can also be identified by the timing at which the outputs of the plurality of arithmetic and logic units 7 transition from the high level to the low level.

Although FIG. 5 illustrates an example in which the seven arithmetic and logic units 7 are provided, the number of the arithmetic and logic units 7 is not particularly limited. Hereinafter, an example in which seven reference binary signals SAE0 to SAE6 are input to the seven arithmetic and logic units 7 will be described.

The plurality of holders 8 in FIG. 5 hold the output signals of the corresponding arithmetic and logic units 7. The respective holder 8 connect alternately input and output nodes of two NAND gates 14 and 15, for example, is connected to an output node of the arithmetic and logic unit 7 corresponding to one NAND gate 14, and inputs a clock signal CK to the other NAND gate 15. Note that the internal configuration of the holder 8 is not limited to that illustrated in FIG. 5.

Figure 6:
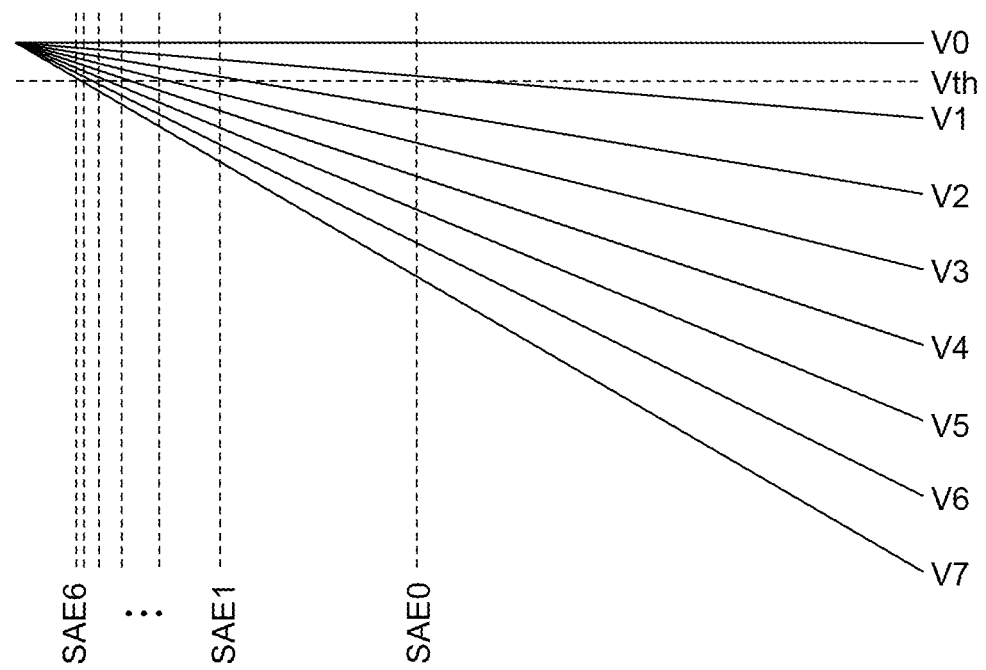
FIG. 6 is a diagram for describing arithmetic processing of the plurality of arithmetic and logic units.

FIG. 6 is a diagram for describing arithmetic processing of the plurality of arithmetic and logic units 7. In FIG. 6, a horizontal axis represents time, and a vertical axis represents a potential of a bit line. Among the reference binary signals SAE0 to SAE6, the reference binary signal SAE6 transitions from the low level to the high level earliest, and each of the reference binary signals SAE5 to SAE0 sequentially transitions to the high level with a delay. Seven broken lines in FIG. 6 indicate timings at which the reference binary signals SAE0 to SAE6 transition to the high level.

The potential of the bit line discharged at least once gradually decreases with a lapse of time. The amount of decrease in the potential of the bit line depends on the discharge amount of the bit line, and the amount of decrease in the potential of the bit line increases as the discharge amount increases. FIG. 6 illustrates potential change waveforms V1 to V7 of the bit line in a case where the discharge of the bit line is performed zero to seven times. For the sake of simplicity, FIG. 6 illustrates an example in which the potential of the bit line linearly changes with time.

In FIG. 6, a threshold voltage Vth of the inverter 12 is indicated by a broken line. When the potential of the bit line input to the inverter 12 falls below the threshold voltage Vth indicated by the broken line in FIG. 6, the output of the inverter 12 transitions from the low level to the high level. As illustrated in FIG. 6, as the number of times of discharge of the bit line increases, the potential of the bit line decreases earlier, and thus, becomes equal to or lower than the threshold voltage of the inverter 12 at a faster timing.

Figure 7:
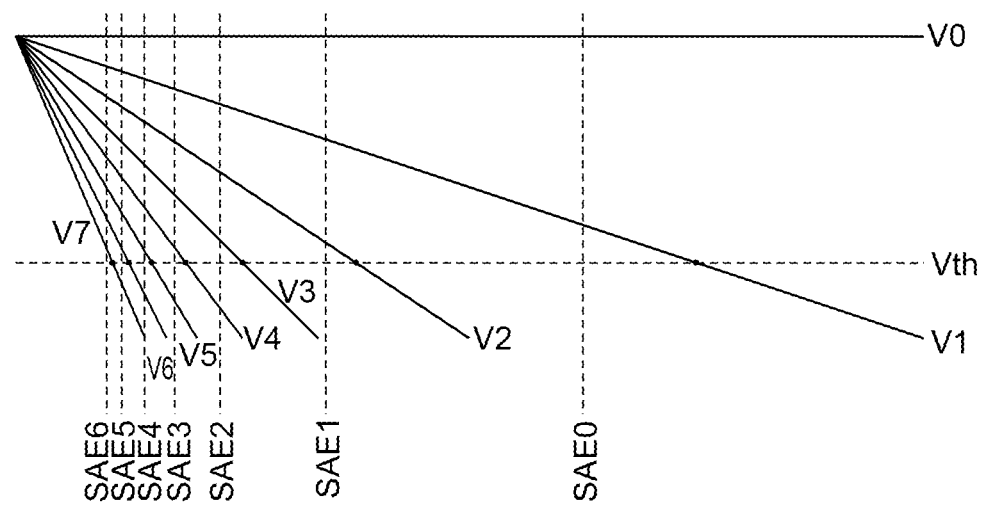
FIG. 7 is a diagram obtained by enlarging a part of FIG. 6.

FIG. 7 is a diagram obtained by enlarging a part of FIG. 6. When bit line potentials V1 to V7 become equal to or lower than the threshold voltage Vth, the output logic of the inverter 12 transitions from the low level to the high level. As illustrated in FIG. 7, each of the reference binary signals SAE0 to SAE6 transitions from the low level to the high level slightly before a timing at which the corresponding bit line potential intersects the threshold voltage Vth. As a result, the output of one more NAND gates 13 can be caused to transition from the high level to the low level at a timing when the output of the inverter 12 transitions from the low level to the high level.

Note that the timing at which the output of each of the arithmetic and logic units 7 transitions from the high level to the low level changes according to the discharge amount of the bit line. For example, in a case where the discharge amount of the bit line is large and the potential of the bit line is extremely low, the outputs transition from the high level to the low level at sequentially shifted timings from the arithmetic and logic unit 7 to which the reference binary signal SAE6 is input to the arithmetic and logic unit 7 to which the reference binary signal SAE0 is input. On the other hand, in a case where the discharge amount of the bit line is small and the potential of the bit line slightly decreases, all the other arithmetic and logic units 7 transition from the high level to the low level almost simultaneously at a timing when the output of the arithmetic and logic unit 7 to which the reference binary signal SAE0 is input transitions from the high level to the low level. In this manner, the outputs of the plurality of arithmetic and logic units 7 do not necessarily transition from the high level to the low level at shifted timings The outputs of two or more arithmetic and logic units 7 sometime change from the high level to the low level almost simultaneously depending on the potential according to the discharge amount of the bit line.

The encoder 9 generates a digital signal according to the discharge amount of the bit line using the number of arithmetic and logic units 7 each outputting the signal at the low level (first logic) the number of arithmetic and logic units 7 each outputting the signal the high level (second logic) at a predetermined timing based on a plurality of signals held by the plurality of holders 8. Alternatively, the encoder 9 generates the digital signal according to the discharge amount of the bit line based on the plurality of signals held by the plurality of holders 8 depending on a timing at which the outputs of the plurality of arithmetic and logic units 7 change from the high level to the low level.

Figure 8:
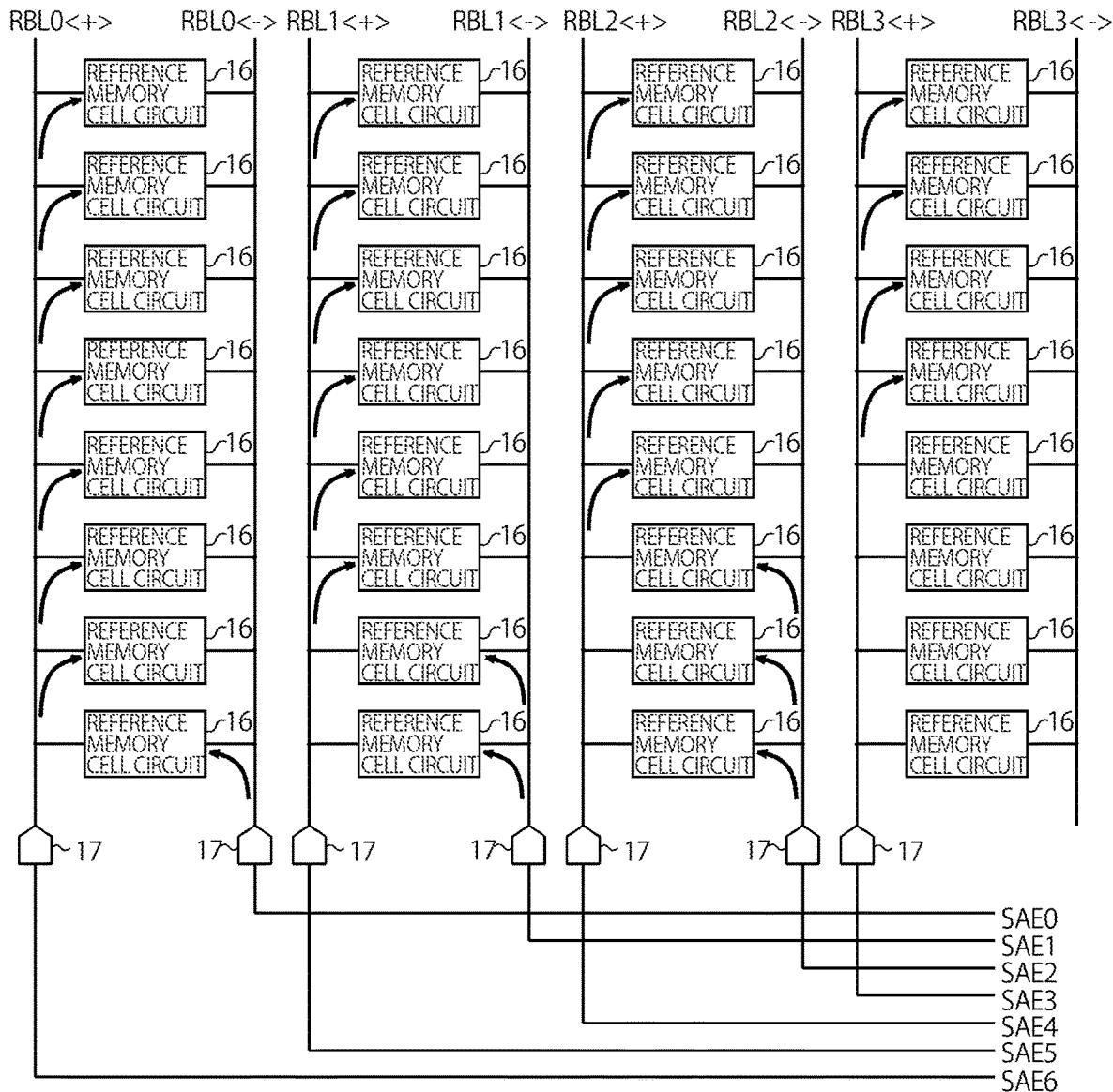
FIG. 8 is a block diagram illustrating an example of an internal configuration of a reference signal generator.

As described above, the reference signal generator 5 can be shared by the plurality of product-sum operation processing units 4. FIG. 8 is a block diagram illustrating an example of an internal configuration of the reference signal generator 5. The reference signal generator 5 in FIG. 8 generates a plurality of reference binary signals corresponding to all possible discharge amounts of the respective bit lines output from the memory cell array 3. For example, FIG. 8 illustrates an example of the internal configuration of the reference signal generator 5 corresponding to a case where discharge is performed once to seven times in the bit line pair BL<+> and BL<−> in the memory cell array 3.

The reference signal generator 5 of FIG. 8 includes four reference bit line pairs RBL<+> and RBL<−>, and eight memory cells MC are connected to each of the reference bit line pairs RBL<+> and RBL<−>. In addition, the reference digital signal generator 17 is connected to one end of each of the seven reference bit lines RBL<+> and RBL<−> among the four reference bit line pairs RBL<+> and RBL<−> in total. The reference binary signals SAE0 to SAE6 are output from the eight reference digital signal generators 17. A plurality of reference memory cell circuits 16 are connected to each of the reference bit line pairs RBL<+> and RBL<−>. Among the eight reference bit lines, seven reference bit lines are set to potentials discharged one to seven times, respectively.

The reference digital signal generator 17 can include, for example, an inverter similarly the digital signal generator 6 of FIG. 5. As a result, it is possible to generate the reference binary signals SAE0 to SAE6 that transition from the low level to the high level at timings according to the number of times of discharge of the reference bit line. The reference binary signals SAE0 to SAE6 can be output to each of the arithmetic and logic unit 7 corresponding to the first digital signal generator and the arithmetic and logic unit 7 corresponding to the second digital signal generator.

Figure 9:
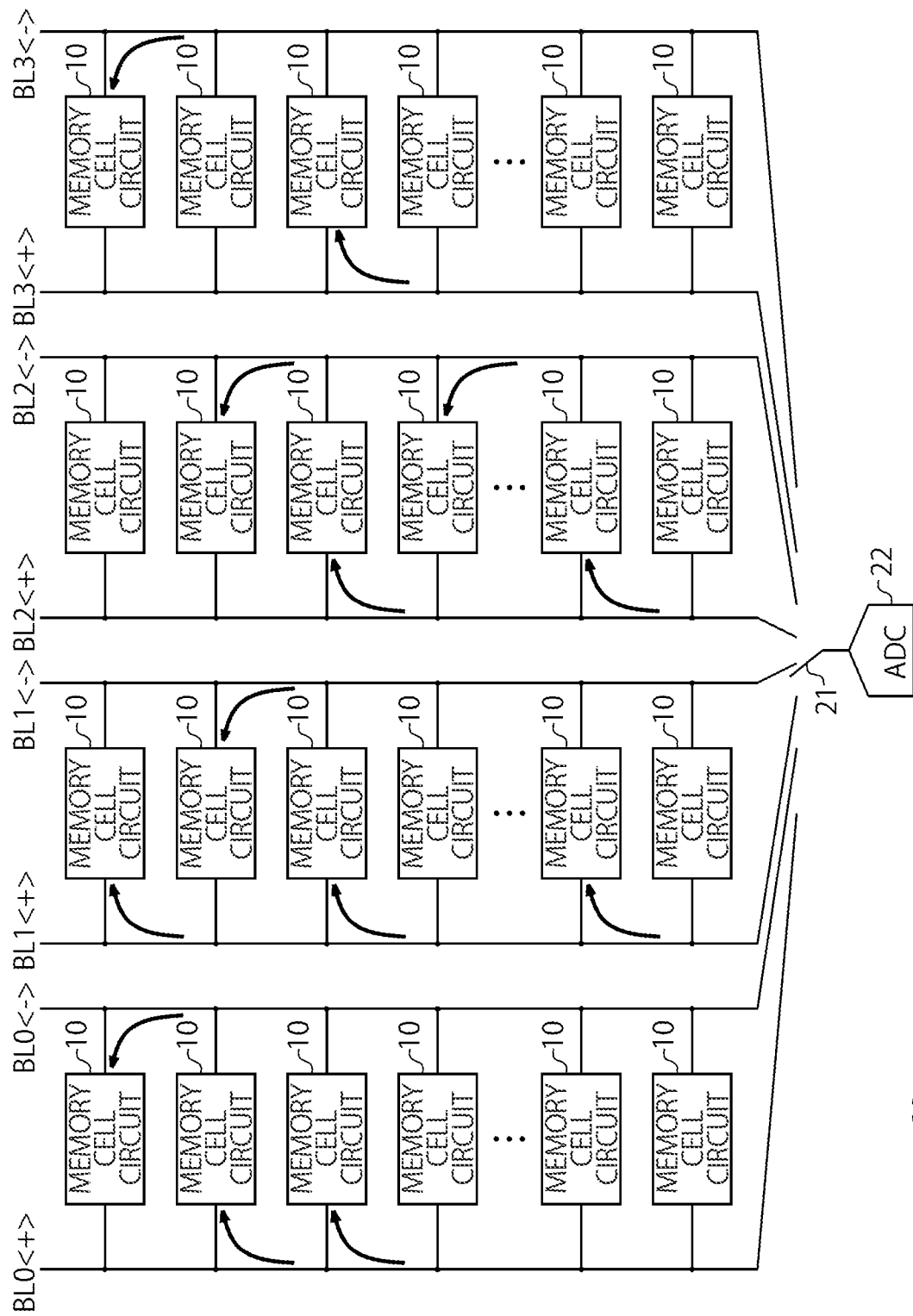
FIG. 9 is a block diagram illustrating a schematic configuration of an analog-to-digital converter according to a comparative example.

FIG. 9 is a block diagram illustrating a schematic configuration of an analog-to-digital converter 20 according to a comparative example. The analog-to-digital converter 20 of FIG. 9 includes: a plurality of bit line pairs BL<+> and BL<−>; a plurality of memory cells MC connected to each of the bit line pairs BL<+> and BL<−>; a bit line selector 21 that selects any one of a plurality of bit lines; and an AD conversion unit (ADC) 22 that converts a potential of the selected bit line into a digital signal.

Figure 10:
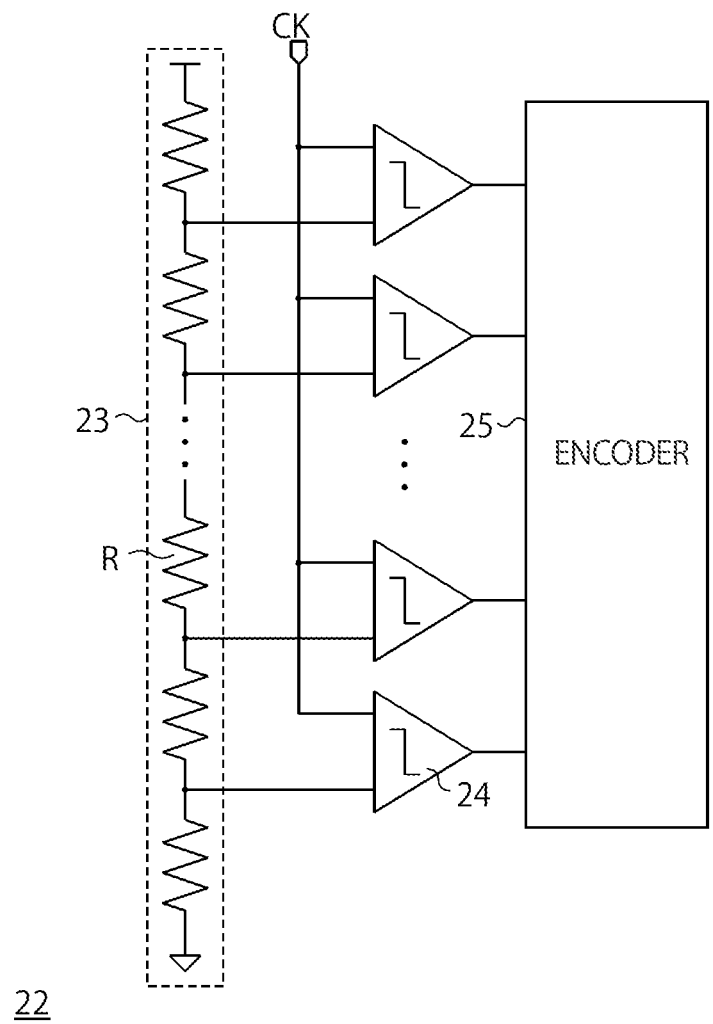
FIG. 10 is a circuit diagram illustrating a specific configuration of an AD conversion unit in FIG. 9.

FIG. 10 is a circuit diagram illustrating a specific configuration of the AD conversion unit 22 of FIG. 9. The AD conversion unit 22 of FIG. 10 includes a reference voltage generator 23 that generates a plurality of reference voltages, a plurality of comparators 24, and an encoder 25.

The reference voltage generator 23 includes a plurality of resistors R connected in series between a power supply voltage node and a ground voltage node, and outputs a plurality of resistance-divided reference voltages from each portion between the plurality of resistors R. The plurality of comparators 24 compare a potential of a bit line selected by the bit line selector 21 with a corresponding reference voltage.

The AD conversion unit 22 in FIG. 10 compares the potential of the bit line selected by the bit line selector 21 with the plurality of reference voltages, and thus, the potential of the bit line can be detected with higher accuracy as the number of comparators 24 is increased. However, a circuit area increases since it is necessary to provide a large number of comparators 24 and the bit line selector 21 is also required. Furthermore, a current always flows through the comparator 24, and thus, power consumption increases.

Figure 11:
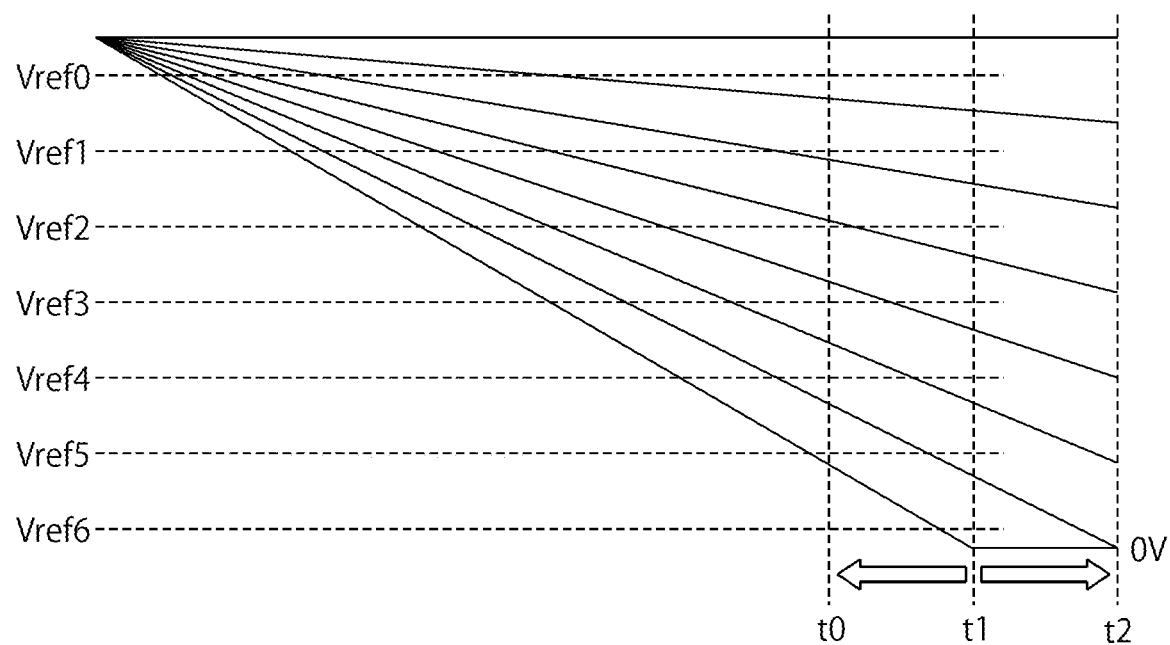
FIG. 11 is a diagram illustrating a timing at which potentials of bit lines are compared by a comparator.

As illustrated in FIG. 6, the potential of the bit line changes at a speed according to a discharge amount. Therefore, assuming that the optimum timing at which the comparison is performed by the comparator 24 is t1 and the comparison is performed by the comparator 24 at a timing t2 delayed from t1 as illustrated in FIG. 11, there is a possibility that the potentials of the bit lines become the same although the discharge amounts of the bit lines are different. Conversely, when a timing at which the comparison is performed by the comparator 24 is too early (t0 in FIG. 11), even if the discharge amounts of the bit lines are different, a difference between the potentials of the bit lines is slight and a voltage difference between the potential of the bit line and the reference voltage is also slight, and thus, there is a possibility that the comparison in the comparator 24 is erroneous. Therefore, there is no guarantee that a correct AD conversion result can be obtained in the AD conversion unit 22 of FIG. 10.

On the other hand, in the present embodiment, the bit line selector 21 is not provided, and each bit line is connected to the input node of the inverter 12 to identify the discharge amount of the bit line based on a difference in timing at which the output logic of the inverter 12 transitions. Thus, it is unnecessary to provide the bit line selector 21 and the plurality of comparators 24, and the potential of the bit line can be converted into the digital signal with a small circuit area and low power consumption. Moreover, according to the present embodiment, there is no need to worry about a timing of detecting the potential of the bit line, and the timing control is easy as compared with the comparative example illustrated in FIGS. 9 and 10.

Although FIG. 5 illustrates the example in which the digital signal generator 6 is configured using the inverter 12, various configurations can be considered in which other circuit components are added to the inverter 12.

Figure 12:
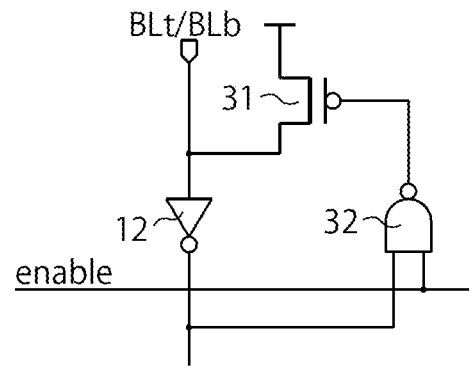
FIG. 12 is a circuit diagram illustrating a first example of a specific configuration of the digital signal generator of FIG. 1.

FIG. 12 is a circuit diagram illustrating a first example of a specific configuration of the digital signal generator 6 of FIG. 1. The digital signal generator 6 of FIG. 12 includes the inverter 12, a PMOS transistor 31, and a NAND gate 32. The PMOS transistor 31 forms a pull-up circuit that pulls up a bit line BLt/BLb. The PMOS transistor 31 has a source connected to the power supply voltage node, and a drain connected to the bit line BLt/BLb. When a gate of the PMOS transistor 31 is at the low level, the PMOS transistor 31 is turned on to pull up the bit line BLt/BLb to the power supply voltage node.

The NAND gate 32 forms a pull-up control circuit that controls the PMOS transistor 31 which is the pull-up circuit. The NAND gate 32 becomes the low level only when both the output signal of the inverter 12 and an enable signal are at the high level. As a result, the PMOS transistor 31 is turned on, and the bit line BLt/BLb is pulled up to the power supply voltage node. When at least one of the output signal of the inverter 12 and the enable signal is at the low level, an output signal of the NAND gate 32 becomes the high level. As a result, the PMOS transistor 31 is turned off, and the pull-up of the bit line BLt/BLb is released.

Figure 13:
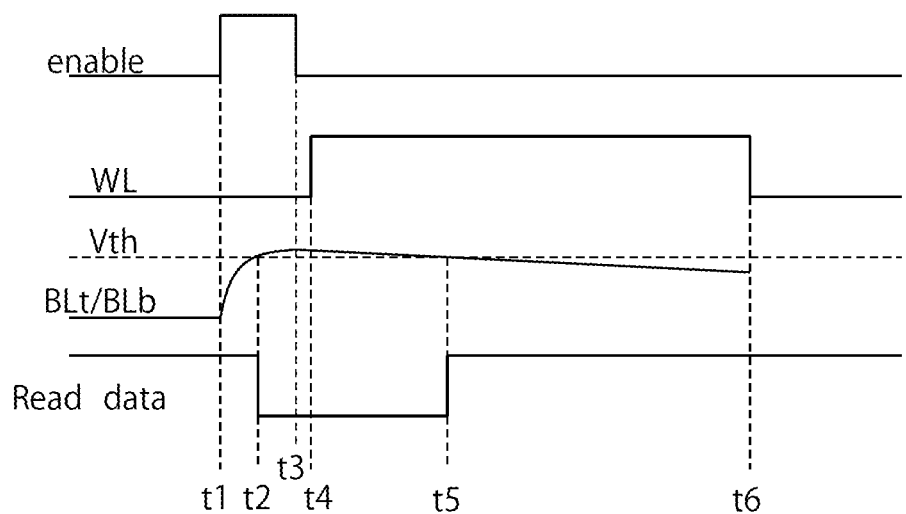
FIG. 13 is a timing diagram of input and output signals of the digital signal generator in FIG. 12.

FIG. 13 is a timing diagram of input and output signals of the digital signal generator 6 in FIG. 12. The bit line BLt/BLb is at the low level in an initial state, and the output of the inverter 12 is at the high level. When the enable signal becomes the high level at time t1, the output of the NAND gate 32 becomes the low level, and the PMOS transistor 31 is turned on. As a result, a potential of the bit line BLt/BLb is pulled up to the high level. As a result, the potential of the bit line BLt/BLb increases, and the output of the inverter 12 transitions to the low level at time t2.

When the output of the inverter 12 becomes the low level, the output of the NAND gate 32 becomes the high level, and the PMOS transistor 31 is turned off. Thus, the pull-up of the bit line BLt/BLb is released. In addition, even when the enable signal becomes the low level at time t3, the output of the NAND gate 32 becomes the high level and the PMOS transistor 31 is turned off, so that the pull-up of the bit line BLt/BLb is released.

At time t4, a word line becomes the high level, and the memory cell MC and the arithmetic control circuit 11 start a product-sum operation. The bit line BLt/BLb is discharged according to a result of the product-sum operation. The potential of the bit line BLt/BLb decreases each time the bit line is discharged. When the potential of the bit line BLt/BLb becomes equal to or lower than the threshold voltage of the inverter 12 at time t5, the output of the inverter 12 transitions to the high level (time t5).

As described above, the potential of the bit line BLt/BLb decreases as the number of times of discharge increases. Therefore, it is desirable to set the threshold of the inverter 12 as low as possible in order to correctly detect the number of times of discharge.

Figure 14:
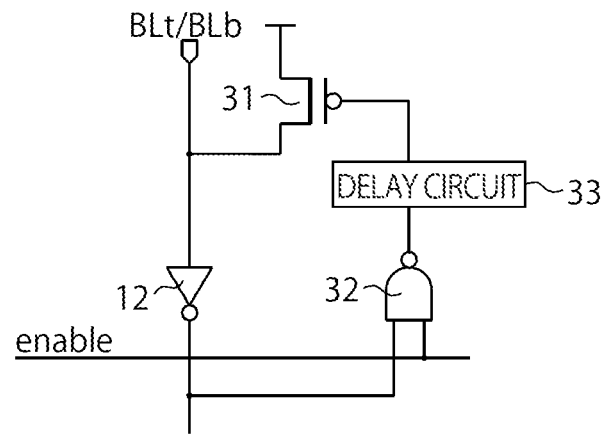
FIG. 14 is a circuit diagram illustrating a second example of the specific configuration of the digital signal generator of FIG. 1.

FIG. 14 is a circuit diagram illustrating a second example of the specific configuration of the digital signal generator 6 of FIG. 1. The digital signal generator 6 of FIG. 14 has the inverter 12 with a lower threshold voltage than the inverter 12 of FIG. 12. In addition, the digital signal generator 6 of FIG. 14 includes a delay circuit 33 connected to an output node of the NAND gate 32. An output signal of the NAND gate 32 is delayed by the delay circuit 33, and then, is input to the gate of the PMOS transistor 31. As a result, a timing at which the PMOS transistor 31 releases the pull-up of the bit line can be delayed.

Figure 15:
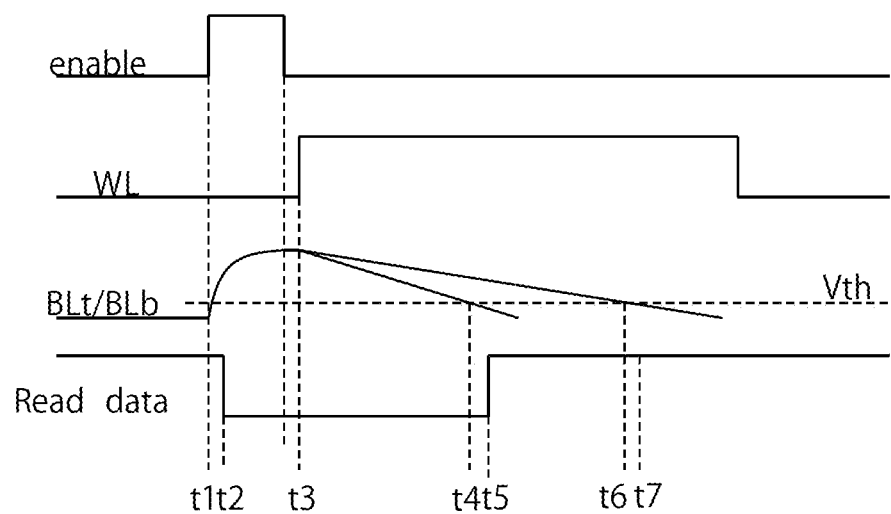
FIG. 15 is a timing diagram of input and output signals of the digital signal generator in FIG. 14.

FIG. 15 is a timing diagram of input and output signals of the digital signal generator 6 in FIG. 14. When the enable signal becomes the high level at time t1, the output of the NAND gate 32 becomes the low level, but a timing at which the PMOS transistor 31 is turned on is slightly delayed from that in FIG. 13 due to the presence of the delay circuit 33.

Thereafter, when the word line becomes high at time t3, the product-sum operation is started, and the potential of the bit line BLt/BLb becomes a potential according to a discharge amount. In addition, the enable signal transitions to the low level around time t3, and thus, the output of the NAND gate 32 becomes the high level. Due to the presence of the delay circuit 33, the PMOS transistor 31 is turned off slightly after the time t3, and the pull-up of the bit line BLt/BLb is released. As a timing of restarting the pull-up is delayed by the delay circuit 33, an output logic of the digital signal generator 6 can be stabilized.

Since the threshold voltage of the inverter 12 is set to be lower than that in FIG. 13, the time until the potential of the bit line BLt/BLb becomes equal to or lower than the threshold voltage becomes long. However, the potential of the bit line BLt/BLb decreases as the discharge amount of the bit line BLt/BLb increases, and thus, a timing at which the potential of the bit line BLt/BLb becomes equal to or lower than the threshold voltage changes according to the discharge amount of the bit line BLt/BLb.

FIG. 15 illustrates a potential waveform of the bit line BLt/BLb having a large discharge amount and a potential waveform of the bit line BLt/BLb having a small discharge amount. Regarding the bit line BLt/BLb having the large discharge amount, the potential becomes equal to or lower than the threshold voltage of the inverter 12 at time t4, and the output of the inverter 12 transitions to the high level at time t5. Regarding the bit line BLt/BLb having the small discharge amount, the potential becomes equal to or lower than the threshold voltage of the inverter 12 at time t6, and the output of the inverter 12 becomes the high level at time t7.

Figure 16:
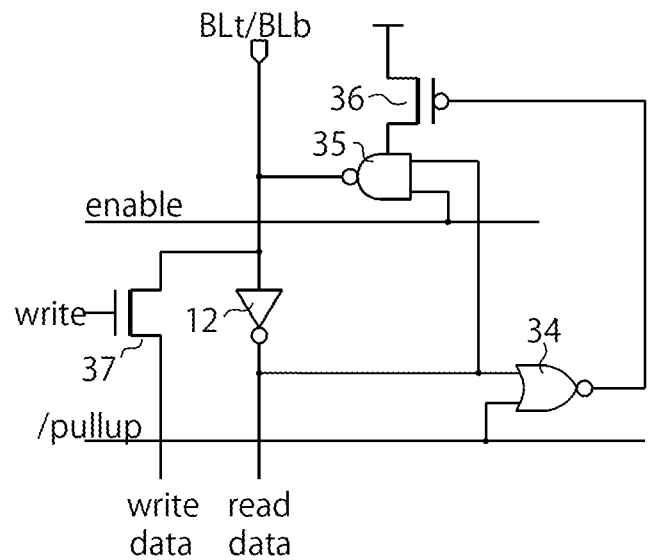
FIG. 16 is a circuit diagram illustrating a third example of the specific configuration of the digital signal generator of FIG. 1.

FIG. 16 is a circuit diagram illustrating a third example of the specific configuration of the digital signal generator 6 of FIG. 1. The digital signal generator 6 of FIG. 16 includes the inverter 12, a NOR gate 34, a NAND gate 35, a PMOS transistor 36, and an NMOS transistor 37.

The NOR gate 34 becomes the low level if at least one of an output signal of the inverter 12 and the pull-up signal/pullup is at the high level, and becomes the high level if not. When an output of the NOR gate 34 becomes the low level, the PMOS transistor 36 is turned on, and the power supply voltage is supplied to the NAND gate 35. The NAND gate 35 performs a negative AND operation when the power supply voltage is supplied via the PMOS transistor 36. More specifically, an output signal of the NAND gate 35 becomes the low level if both the output signal of the inverter 12 and the enable signal are at the high level, and becomes the high level if not. The NMOS transistor 37 is turned on when a write signal is at the high level. When the NMOS transistor 37 is turned on, write data is supplied to the bit line BLt/BLb via the NMOS transistor 37. The output signal of the inverter 12 is a read signal that outputs a product-sum operation result.

Figure 17:
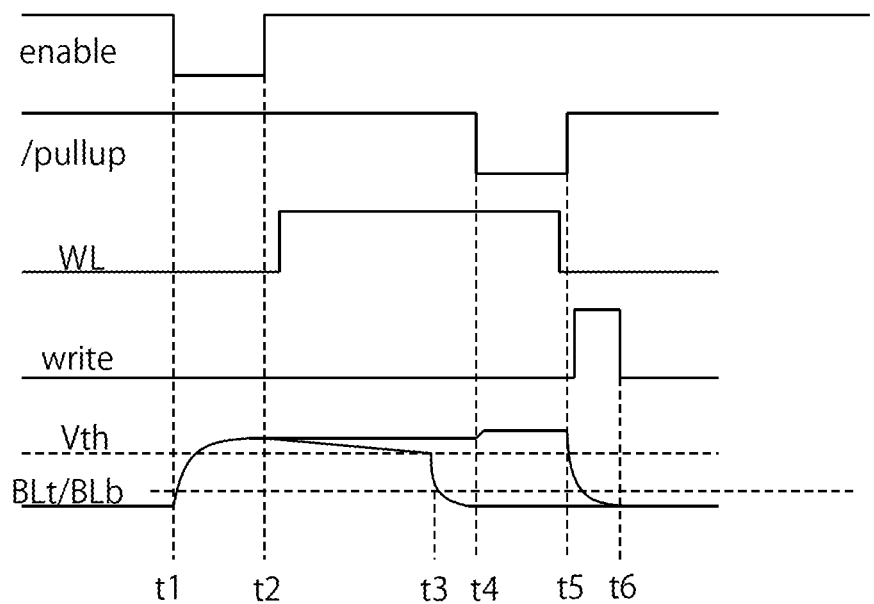
FIG. 17 is a timing diagram of input and output signals of the digital signal generator in FIG. 16.

FIG. 17 is a timing diagram of input and output signals of the digital signal generator 6 in FIG. 16. During a period in which the pull-up signal/pullup is at the high level (other than times t4 to t5), the output of the NOR gate 34 is at the low level, the PMOS transistor 36 is turned on, and the power supply voltage is supplied to the NAND gate 35. During a period from time t1 to time t2, the enable signal is at the low level, the output signal of the NAND gate 35 is at the high level, and the bit line BLt/BLb is pulled up.

The word line WL becomes the high level about time t2, and the bit lines BLt and BLb are discharged according to the product-sum operation result. When the potential of the bit line BLt/BLb becomes equal to or lower than the threshold voltage of the inverter 12 at time t3, the output signal of the inverter 12 transitions to the high level, the output of the NAND gate 35 transitions to the low level, and the potential of the bit line BLt/BLb decreases.

On the other hand, when the bit line BLt/BLb is not discharged, the pull-up of the bit line BLt/BLb is continued until time t4. If the potential of the bit line BLt/BLb is equal to or higher than the threshold voltage of the inverter 12 at time t4, the output of the NOR gate 34 transitions to the high level, the PMOS transistor 36 is turned off, and the output of the NAND gate 35 becomes unstable.

When the write signal becomes the high level near time t5, the NMOS transistor 37 is turned on, and the write data is supplied from the outside to the bit line BLt/BLb via the NMOS transistor 37.

Figure 18:
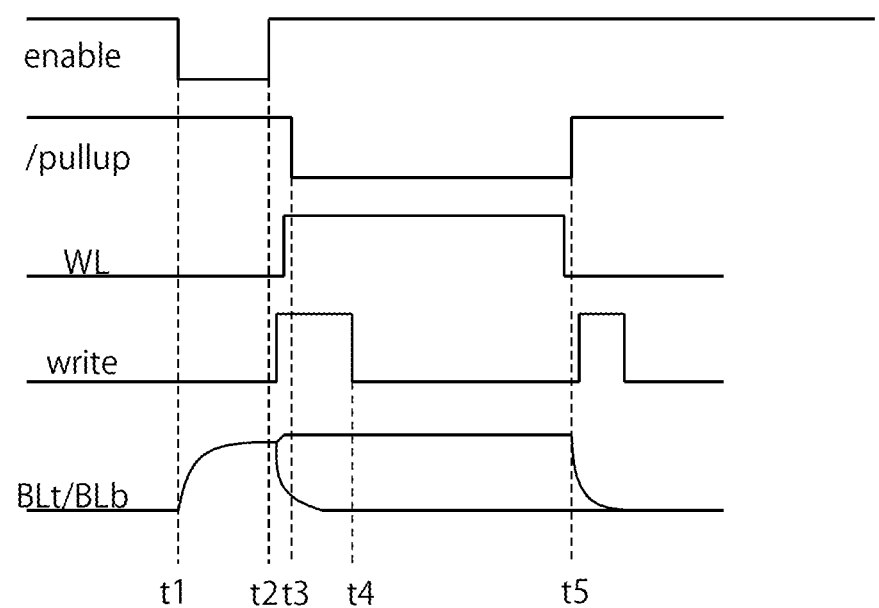
FIG. 18 is a timing diagram in which timings of some signals are different from those in FIG. 17.

FIG. 18 is a timing diagram in which timings of some signals are different from those in FIG. 17. Since the enable signal is at the low level from time t1 to t2, the output of the NAND gate 35 is at the high level, and the bit line BLt/BLb is pulled up. When the pull-up signal/pullup transitions to the low level at time t3, the output of the NOR gate 34 becomes the high level, the PMOS transistor 36 is turned off, and the output of the NAND gate 35 becomes unstable.

At time t3, the potential of the bit line BLt/BLb decreases according to the discharge amount of the bit line BLt/BLb. When the bit line BLt/BLb is not discharged at all, the potential of the bit line BLt/BLb slightly increases.

In addition, when the write signal transitions to the high level near time t2, the NMOS transistor 37 is turned on, and the write data is supplied from the outside to the bit line BLt/BLb via the NMOS transistor 37.

Figure 19:
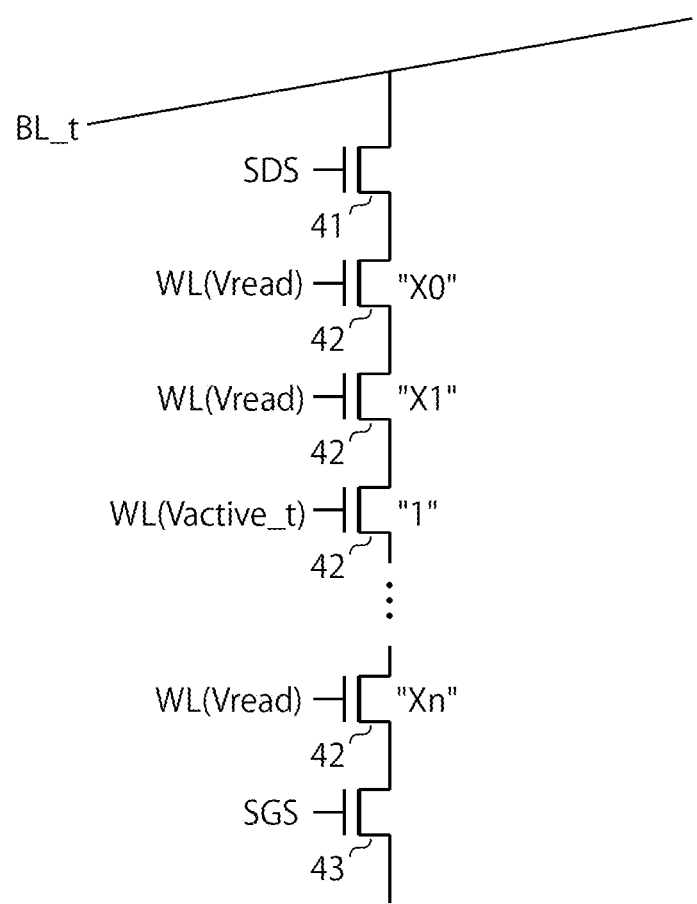
FIG. 19 is a conceptual diagram in a case where the semiconductor integrated circuit according to the present embodiment is configured using a NAND flash memory cell.

As described above, the memory cell MC in the memory cell array 3 according to the present embodiment may be the volatile memory cell, such as the SRAM and the DRAM, or may be the nonvolatile memory cell such as the flash memory and the MRAM. FIG. 19 is a conceptual diagram in a case where the semiconductor integrated circuit 1 according to the present embodiment is configured using the NAND flash memory cell MC. FIG. 19 illustrates one memory string in which a plurality of NAND flash memory cell transistors are connected in cascade. The memory string of FIG. 19 includes: a select transistor 41 connected in cascade between the bit line BLt/BLb and the ground node; a plurality of NAND flash memory cell transistors (hereinafter, referred to as memory cell transistors) 42; and a select transistor 43. The NAND flash memory cells MC respectively including the memory cell transistors 42 stores, for example, different weighting factors for a product-sum operation. Corresponding word lines are connected to gates of the plurality of memory cell transistors 42. A select gate line SDS is connected to a gate of the select transistor 41, and a select gate line SGS is connected to a gate of the select transistor 43. As each of the word lines of the memory cell transistors 42 is set to the high level in a state where the select transistors 41 and 43 are turned on, each of the memory cell transistors 42 is turned on, and the bit line BLt/BLb is discharged according to data stored in each of the NAND flash memory cells MC.

In this manner, the discharge amount of the bit line is identified based on the timing at which the output of the inverter 12 transitions by focusing on the fact that the timing at which the potential of the bit line becomes equal to or lower than the threshold voltage of the inverter 12 differs according to the discharge amount of the bit line in the present embodiment. As a result, it is unnecessary to provide the plurality of comparators 24 for comparing the reference voltages at different voltage levels with the potential of the bit line. Thus, the discharge amount of the bit line can be converted into the digital signal with a small circuit area and low power consumption according to the present embodiment. In addition, according to the present embodiment, it is unnecessary to worry about a timing of monitoring the potential of the bit line, and the timing control becomes easy.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor integrated circuit comprising:
a digital signal generator that generates a binary signal whose logic transitions at a timing according to a discharge amount of a second wiring which is discharged when multiplication data of first data stored in a memory cell and second data on a first wiring is a first logic; and
a transition timing detector that detects a timing at which the logic of the binary signal transitions.

2. The semiconductor integrated circuit according to claim 1, wherein
the transition timing detector includes a plurality of arithmetic and logic units that compare the binary signal with a plurality of reference binary signals whose logics transition at timings according to different discharge amounts of the second wiring.

3. The semiconductor integrated circuit according to claim 2, wherein
an output logic differs between the arithmetic and logic unit to which the reference binary signal whose logic transitions at a timing earlier than a timing at which the logic of the binary signal changes is input and the arithmetic and logic unit to which the reference binary signal whose logic transitions at a timing later than the timing at which the logic of the binary signal changes is input, among the plurality of arithmetic and logic units and the plurality of reference binary signals.

4. The semiconductor integrated circuit according to claim 3, wherein
among the plurality of arithmetic and logic units and the plurality of reference binary signals, the arithmetic and logic unit to which the reference binary signal whose logic transitions at the timing earlier than the timing at which the logic of the binary signal changes is input outputs a signal of the first logic, and
the arithmetic and logic unit to which the reference binary signal whose logic transitions at the timing later than the timing at which the logic of the binary signal changes is input outputs a signal of a second logic.

5. The semiconductor integrated circuit according to claim 4, further comprising:
a plurality of holders that hold a plurality of signals output from the plurality of arithmetic and logic units; and
an encoder that generates a digital signal according to a discharge amount of the second wiring using a number of the arithmetic and logic units each outputting the signal of the first logic and a number of the arithmetic and logic units each outputting the signal of the second logic at a predetermined timing based on the plurality of signals held by the plurality of holders.

6. The semiconductor integrated circuit according to claim 4, further comprising:
a plurality of holders that hold a plurality of signals output from the plurality of arithmetic and logic units; and
an encoder that generates a digital signal according to a discharge amount of the second wiring depending on a timing at which outputs of the plurality of arithmetic and logic units change from the second logic to the first logic based on the plurality of signals held by the plurality of holders.

7. The semiconductor integrated circuit according to claim 2, further comprising
a plurality of holders that hold a plurality of signals output from the plurality of arithmetic and logic units.

8. The semiconductor integrated circuit according to claim 7, further comprising
an encoder that generates a digital signal according to a discharge amount of the second wiring based on the plurality of signals held by the plurality of holders.

9. The semiconductor integrated circuit according to claim 1, wherein
the digital signal generator includes a logic inverter that causes a transition of the logic of the binary signal when a potential of the second wiring becomes equal to or lower than a predetermined threshold voltage.

10. The semiconductor integrated circuit according to claim 9, wherein
the digital signal generator includes a pull-up circuit that pulls up the second wiring in a state before a transition of the output logic.

11. The semiconductor integrated circuit according to claim 10, wherein
the digital signal generator includes a pull-up control circuit that releases the pull-up of the second wiring caused by the pull-up circuit when the output logic transitions.

12. The semiconductor integrated circuit according to claim 1, further comprising:
a plurality of the memory cells arranged in a first direction and each storing the first data;
a plurality of the first wirings provided to correspond to the plurality of memory cells arranged in the first direction and supplying the second data to be multiplied by the first data; and
a second wiring pair provided to correspond to the plurality of memory cells arranged in the first direction and that includes one second wiring which is discharged when multiplication data of the first data, stored in each of the plurality of memory cells, and the second data, supplied by the first wiring corresponding to the memory cell, is the first logic; and another second wiring which is discharged when the multiplication data is a second logic.

13. The semiconductor integrated circuit according to claim 12, wherein
the digital signal generator includes:
a first digital signal generator that generates a binary signal whose logic transitions at a timing according to a discharge amount of the one second wiring; and
a second digital signal generator that generates a binary signal whose logic transitions at a timing according to the discharge amount of the other second wiring.

14. The semiconductor integrated circuit according to claim 13, wherein
the plurality of arithmetic and logic units that compare the binary signal generated by the first digital signal generator with the plurality of reference binary signals are provided separately from the plurality of arithmetic and logic units that compare the binary signal generated by the second digital signal generator with the plurality of reference binary signals.

15. The semiconductor integrated circuit according to claim 13, further comprising
a reference signal generator that generates a plurality of reference binary signals, wherein
the plurality of reference binary signals generated by the reference signal generator are used for comparison with the binary signal generated by the first digital signal generator, and used for comparison with the binary signal generated by the second digital signal generator.

16. The semiconductor integrated circuit according to claim 15, wherein
the reference signal generator generates the plurality of reference binary signals corresponding to different discharge amounts of the second wiring.

17. The semiconductor integrated circuit according to claim 15, wherein
the reference signal generator includes:
a plurality of reference memory cells arranged in the first direction and each storing the first data;
a reference wiring pair provided to correspond to the plurality of reference memory cells arranged in the first direction, and that includes one reference wiring which is discharged when multiplication data of the first data, stored in each of the plurality of reference memory cells, and the second data, supplied by the first wiring corresponding to the reference memory cell, is the first logic; and another reference wiring which is discharged when the multiplication data is the second logic;
a first reference digital signal generator that generates a reference binary signal whose logic transitions at a timing according to a discharge amount of the one reference wiring; and
a second reference digital signal generator that generates a reference binary signal whose logic transitions at a timing according to a discharge amount of the other reference wiring, and
the plurality of first wirings are provided to correspond to each of the plurality of reference memory cells arranged in the first direction, and supply the second data to be multiplied by the first data.

18. The semiconductor integrated circuit according to claim 12, wherein
a plurality of the digital signal generators, a plurality of the memory cells, and a plurality of the second wiring pairs are arranged in a second direction intersecting the first direction.

19. The semiconductor integrated circuit according to claim 18, further comprising
a reference signal generator that generates a plurality of reference binary signals in the second direction, wherein
the reference signal generator includes:
a plurality of reference memory cells arranged in the first direction and each storing the first data;
the plurality of first wirings provided to correspond to the plurality of reference memory cells arranged in the first direction and supplying the second data to be multiplied by the first data;
a reference wiring pair provided to correspond to the plurality of reference memory cells arranged in the first direction, and that includes one reference wiring which is discharged when multiplication data of the first data, stored in each of the plurality of reference memory cells, and the second data, supplied by the first wiring corresponding to the reference memory cell, is the first logic; and another reference wiring which is discharged when the multiplication data is the second logic;
a first reference digital signal generator that generates a reference binary signal whose logic transitions at a timing according to a discharge amount of the one reference wiring; and
a second reference digital signal generator that generates a reference binary signal whose logic transitions at a timing according to a discharge amount of the other reference wiring, and
the plurality of reference memory cells, a plurality of the reference wiring pairs, a plurality of the first reference digital signal generators, and a plurality of the second reference digital signal generators are arranged in the second direction.

20. An analog-to-digital converter comprising:
a digital signal generator that generates a binary signal whose logic transitions at a timing according to a discharge amount of a second wiring which is discharged when multiplication data of first data, stored in a memory cell, and second data on a first wiring is a first logic;
a plurality of arithmetic and logic units that detect a timing at which the logic of the binary signal transitions;
a plurality of holders that hold a plurality of signals output from the plurality of arithmetic and logic units; and
an encoder that generates a digital signal according to a discharge amount of the second wiring based on the plurality of signals held by the plurality of holders.

* * * * *